United States Patent
Aydin et al.

(10) Patent No.: US 11,676,813 B2
(45) Date of Patent: Jun. 13, 2023

(54) DOPING SEMICONDUCTOR FILMS

(71) Applicant: Applied Materials, Inc., Santa Clara, CA (US)

(72) Inventors: Aykut Aydin, Sunnyvale, CA (US); Rui Cheng, San Jose, CA (US); Yi Yang, San Jose, CA (US); Krishna Nittala, San Jose, CA (US); Karthik Janakiraman, San Jose, CA (US); Bo Qi, San Jose, CA (US); Abhijit Basu Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 105 days.

(21) Appl. No.: 17/025,009

(22) Filed: Sep. 18, 2020

(65) Prior Publication Data
US 2022/0093390 A1 Mar. 24, 2022

(51) Int. Cl.
*H01L 21/02* (2006.01)
*H01L 21/324* (2006.01)
(Continued)

(52) U.S. Cl.
CPC .......... *H01L 21/0257* (2013.01); *C23C 16/24* (2013.01); *C23C 16/30* (2013.01);
(Continued)

(58) Field of Classification Search
CPC .......... H01L 21/0257; H01L 21/02532; H01L 21/027; H01L 21/324; C23C 16/24;
(Continued)

(56) References Cited

U.S. PATENT DOCUMENTS 6,500,771 B1 12/2002 Vassiliev et al.
8,137,872 B2 * 3/2012 Hayashi .................. G03F 1/24
430/5
(Continued)

FOREIGN PATENT DOCUMENTS

CN 102326229 A 1/2012
CN 109643639 A 4/2019
KR 2011-0063386 A 6/2011

OTHER PUBLICATIONS

International Search Report and Written Opinion dated Jan. 3, 2022 in International Patent Application No. PCT/US2021/050358, 8 pages.

*Primary Examiner* — Dale E Page
*Assistant Examiner* — Quovaunda Jefferson
(74) *Attorney, Agent, or Firm* — Kilpatrick Townsend & Stockton LLP

(57) ABSTRACT

Exemplary deposition methods may include delivering a silicon-containing precursor and a boron-containing precursor to a processing region of a semiconductor processing chamber. The methods may include delivering a dopant-containing precursor with the silicon-containing precursor and the boron-containing precursor. The dopant-containing precursor may include one or more of carbon, nitrogen, oxygen, or sulfur. The methods may include forming a plasma of all precursors within the processing region of the semiconductor processing chamber. The methods may include depositing a silicon-and-boron material on a substrate disposed within the processing region of the semiconductor processing chamber. The silicon-and-boron material may include greater than or about 1 at. % of a dopant from the dopant-containing precursor.

18 Claims, 2 Drawing Sheets

(51) Int. Cl.
  *H01J 37/32*  (2006.01)
  *C23C 16/56*  (2006.01)
  *C23C 16/50*  (2006.01)
  *C23C 16/30*  (2006.01)
  *C23C 16/24*  (2006.01)

(52) U.S. Cl.
  CPC ............. *C23C 16/50* (2013.01); *C23C 16/56* (2013.01); *H01J 37/3244* (2013.01); *H01L 21/02532* (2013.01); *H01L 21/324* (2013.01); *H01J 2237/332* (2013.01)

(58) Field of Classification Search
  CPC ......... C23C 16/28; C23C 16/30; C23C 16/50; C23C 16/56; H01J 37/3244; H01J 2237/332
  See application file for complete search history.

(56) References Cited

U.S. PATENT DOCUMENTS

| | | | |
|---|---|---|---|
| 2001/0051215 A1* | 12/2001 | Arkles | .............. H01L 21/28568 427/255.393 |
| 2010/0255661 A1 | 10/2010 | Vatus et al. | |
| 2012/0258261 A1 | 10/2012 | Reddy et al. | |
| 2013/0157466 A1* | 6/2013 | Fox | .................. H01L 21/31111 118/704 |
| 2019/0326110 A1 | 10/2019 | Gadre et al. | |
| 2020/0211834 A1* | 7/2020 | Yang | .................. C23C 16/0209 |

\* cited by examiner

DOPING SEMICONDUCTOR FILMS

TECHNICAL FIELD

The present technology relates to semiconductor deposition processes. More specifically, the present technology relates to methods of depositing materials with dopants to impact transparency of the film.

BACKGROUND

Integrated circuits are made possible by processes which produce intricately patterned material layers on substrate surfaces. Producing patterned material on a substrate requires controlled methods of formation and removal of exposed material. As device sizes continue to shrink, material properties may affect subsequent operations. For example, transparency of masking materials may affect subsequent etching processes.

Thus, there is a need for improved systems and methods that can be used to produce high quality devices and structures. These and other needs are addressed by the present technology.

SUMMARY

Exemplary deposition methods may include delivering a silicon-containing precursor and a boron-containing precursor to a processing region of a semiconductor processing chamber. The methods may include delivering a dopant-containing precursor with the silicon-containing precursor and the boron-containing precursor. The dopant-containing precursor may include one or more of carbon, nitrogen, oxygen, or sulfur. The methods may include forming a plasma of all precursors within the processing region of the semiconductor processing chamber. The methods may include depositing a silicon-and-boron material on a substrate disposed within the processing region of the semiconductor processing chamber. The silicon-and-boron material may include greater than or about 1 at. % of a dopant from the dopant-containing precursor.

In some embodiments, the silicon-and-boron material may be characterized by an extinction coefficient of less than or about 0.3 at 633 nm. A hydrogen concentration within the film may be maintained below or about 3 at. %. The methods may include delivering a germanium-containing precursor with the silicon-containing precursor and the boron-containing precursor. The methods may include subsequent the depositing, performing a thermal anneal of the silicon-and-boron material. The thermal anneal may be performed at a temperature of greater than or about 500° C. Subsequent the thermal anneal, a material stress of the material deposited may be less than or about 1.5 GPa. The silicon-containing precursor may be or include silane, and the boron-containing precursor may be or include diborane. The dopant-containing precursor may be or include nitrous oxide.

Some embodiments of the present technology may encompass deposition methods. The methods may include delivering a deposition precursor including boron, silicon, or germanium to a processing region of a semiconductor processing chamber. The methods may include providing a dopant including carbon, nitrogen, sulfur, or oxygen to the processing region. The methods may include forming a plasma of the deposition precursor and the dopant within the processing region of the semiconductor processing chamber. The methods may include depositing a material incorporating the dopant. The material may be characterized by an extinction coefficient of less than or about 0.35 at 633 nm.

In some embodiments, the methods may include annealing the material deposited to a temperature above 500° C. Subsequent the annealing, a material stress of the material deposited may be less than or about 1.5 GPa. The extinction coefficient may be less than or about 0.30 at 633 nm. The dopant may be incorporated within the film at greater than or about 2 at. %. At least two dopants may be incorporated within the film. The material deposited may be or include silicon, boron, and germanium.

Some embodiments of the present technology may encompass deposition methods. The methods may include delivering at least one of a silicon-containing precursor, a boron-containing precursor, or a germanium-containing precursor to a processing region of a semiconductor processing chamber. The methods may include delivering a dopant-containing precursor to the processing region of the semiconductor processing chamber. The dopant-containing precursor may include one or more of carbon, nitrogen, oxygen, or sulfur. The methods may include forming a plasma of all precursors within the processing region of the semiconductor processing chamber. The methods may include depositing a doped material on a substrate disposed within the processing region of the semiconductor processing chamber. The doped material may include greater than or about 1 at. % of a dopant from the dopant-containing precursor.

In some embodiments, the methods may include, subsequent the depositing, performing a thermal anneal of the silicon-and-boron material at a temperature above or about 400° C. Subsequent the annealing, a material stress of the material deposited may be less than or about 1.5 GPa. The extinction coefficient of the doped material may be less than or about 0.30 at 633 nm.

Such technology may provide numerous benefits over conventional systems and techniques. For example, the processes may produce films characterized by reduced surface roughness. Additionally, the operations of embodiments of the present technology may produce improved mask materials that may facilitate processing operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
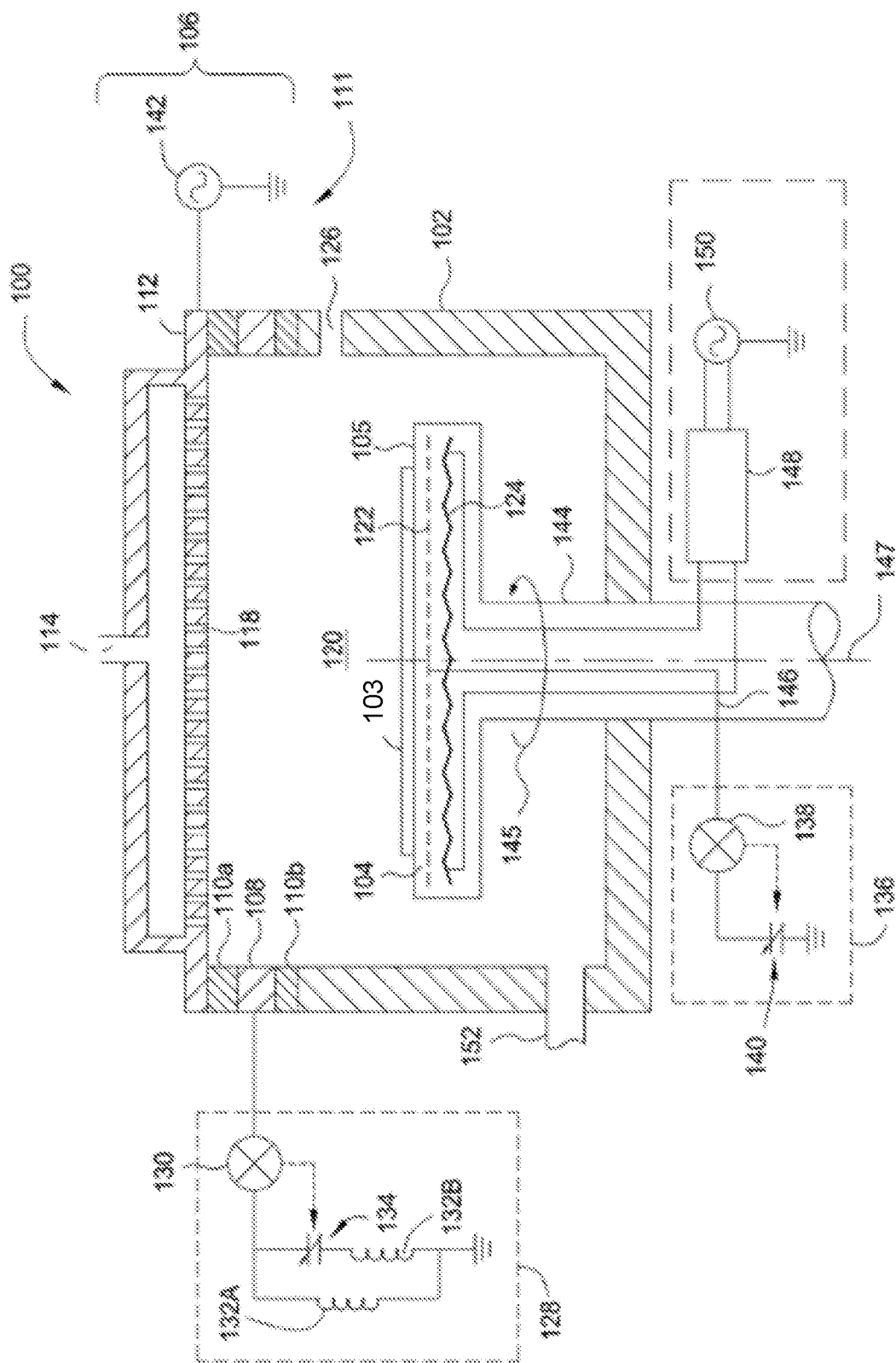
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor fabrication, structures may be produced on a substrate utilizing a variety of deposition and etching operations. Mask materials may be used to allow materials to be partially etched, or etched to produce features across the substrate. As device sizes continue to reduce, and improved selectivity between materials may ease structural formation, utilizing improved hard masks may facilitate fabrication. For example, compared to a thermally produced amorphous silicon hard mask, a silicon film incorporating boron may be characterized by improved hardness and other material properties, facilitating the film use as a mask material. However, many semiconductor fabrication processes are utilizing thicker hardmask films for larger vertical device structures. While a hardmask may be characterized by a sufficient transparency at one thickness, as the thickness increases, the film may become less transparent. When a film becomes sufficiently opaque, processes may require additional operations to open areas near alignment markers to ensure correct orientation.

Some conventional technologies may improve transparency by increasing hydrogen concentration within the mask being formed. This may cause multiple issues. For example, although increasing hydrogen may reduce an extinction coefficient, it may reduce the selectivity of the film produced in subsequent etching, which may reduce the effectiveness of the mask, and in some cases may cause the mask to be unsuitable for the process to be performed. Additionally, increased hydrogen incorporation may impact feasibility of subsequent thermal processes. For example, a subsequent anneal may cause hydrogen outgassing, which can greatly increase a tensile stress in the film. In many cases, this stress may cause the film to crack.

The present technology may overcome these limitations by adjusting deposition parameters and materials to reduce an extinction coefficient of the deposited films without incorporating additional hydrogen. For example, the present technology may include additional dopants, such as oxygen, carbon, nitrogen, or sulfur. These materials may form more transparent films, while having a limited impact on etch selectivity. Additionally, the materials may allow subsequent anneals to be performed while limiting a change in stress to reduce cracking and film failure. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
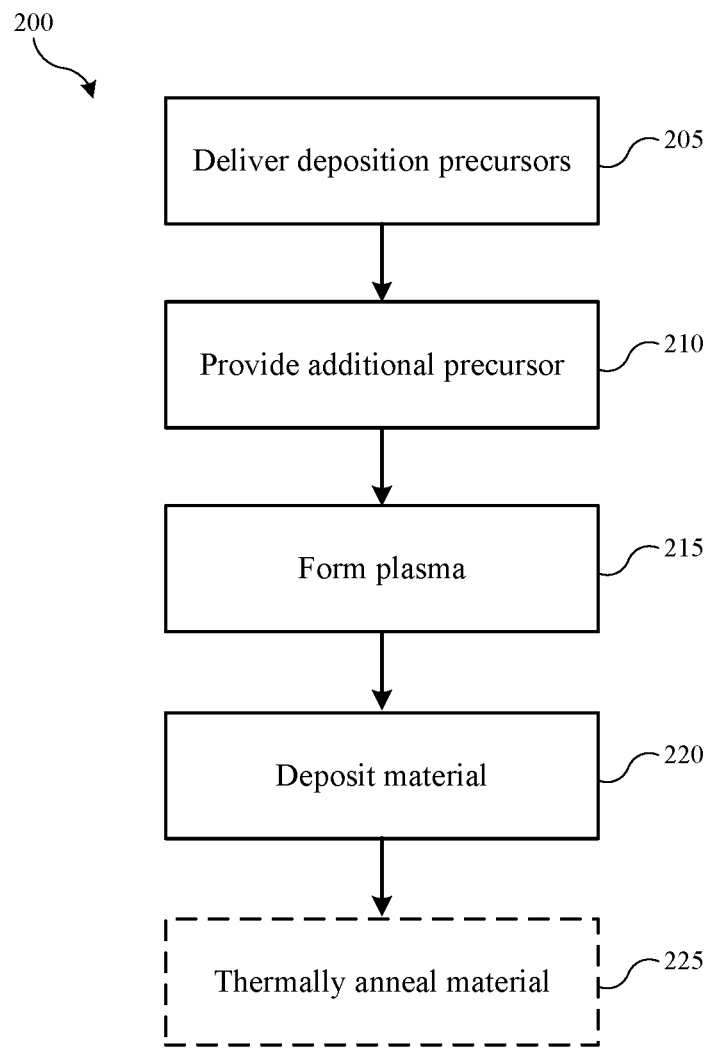
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 200 may include additional operations prior to initiation of the listed operations. For example, additional processing operations may include forming structures on a semiconductor substrate, which may include both forming and removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above.

The substrate may be any number of materials on which materials may be deposited. The substrate may be or include silicon, germanium, dielectric materials including silicon oxide or silicon nitride, metal materials, or any number of combinations of these materials, which may be the substrate, or materials formed on the substrate. In some embodiments optional treatment operations, such as a pretreatment, may be performed to prepare a surface of the substrate for deposition. For example, a pretreatment may be performed to provide certain ligand terminations on the surface of the substrate, and which may facilitate nucleation of a film to be deposited. For example, hydrogen, oxygen, carbon, nitrogen, or other molecular terminations, including any combination of these atoms or radicals, such as amidogen or other functional groups, as non-limiting examples, may be adsorbed, reacted, or formed on a surface of the substrate. Additionally, material removal may be performed, such as reduction of native oxides or etching of material, or any other operation that may prepare one or more exposed surfaces of the substrate for deposition.

At operation 205, one or more precursors may be delivered to the processing region of the chamber. For example, the film being deposited may be a mask film used in semiconductor processing. The deposition precursors may include any number of mask precursors, including a silicon-containing precursor, a germanium-containing precursor, and/or a boron-containing precursor. The precursors may be flowed together or separately. For example, in exemplary embodiments in which a boron-incorporated silicon film may be formed, a silicon-containing precursor and a boron-containing precursor may be delivered to the processing region of the processing chamber. Plasma enhanced deposition may be performed in some embodiments of the present technology, which may facilitate material reactions and deposition. Additionally, a germanium-containing precursor may also be flowed to produce a silicon-boron-germanium material on the substrate.

Masks including silicon, boron, or germanium materials or alloys may be relatively opaque, which as described above, may challenge processing and require additional operations during processing. Although hydrogen content within these materials may be increased to reduce an extinction coefficient and improve transparency, the hydrogen may detrimentally impact etch selectivity, and may cause the material to crack during a subsequent anneal due to hydrogen outgassing. The present technology may utilize a non-hydrogen dopant to improve transparency, which may additionally maintain etch selectivity and integrity during subsequent annealing operations. Some embodiments of the present technology may include additionally providing a dopant-containing precursor at operation 210, and which is provided with the other deposition precursors. The precursors delivered may all be used to form a plasma within the processing region of the semiconductor processing chamber at operation 215. At operation 220, a material may be deposited on the substrate that includes the dopant within the deposited material. By incorporating the dopant-containing precursor in some embodiments, stress may be controlled within the film, while producing a film with increased transparency and lower extinction coefficients.

Depending on the precursors used, a flow rate of the dopant precursor may be used to control incorporation of the dopant. For example, such as for an oxygen dopant, while the flow rates of the other deposition precursors may be hundreds of sccm or more, the dopant precursor may be flowed at a flow rate less than or about 250 sccm, and may be delivered at a flow rate less than or about 200 sccm, less than or about 150 sccm, less than or about 100 sccm, less than or about 50 sccm, less than or about 40 sccm, less than or about 30 sccm, less than or about 25 sccm, less than or about 20 sccm, less than or about 15 sccm, less than or about 10 sccm, less than or about 5 sccm, or less. Additionally, for other dopants, the flow rates may be higher. For example, for a nitrogen dopant, the flow rate may be greater than or about 500 sccm, and may be greater than or about 750 sccm, greater than or about 1000 sccm, greater than or about 1250 sccm, greater than or about 1500 sccm, greater than or about 1750 sccm, or more, although in an exemplary film formation a small fraction may be incorporated.

Any number of precursors may be used with the present technology with regard to the silicon-containing precursor and the boron-containing precursor. For example, the silicon-containing precursor may include any silicon-containing material, such as organosilanes, which may include silane, disilane, and other materials. Additional silicon-containing materials may include silicon, carbon, oxygen, or nitrogen, such as trisilylamine. Germanium-containing precursors may include germane or any other germanium-containing precursor, such as additionally including hydrogen, nitrogen, or carbon. Boron-containing materials may include boranes, such as borane, diborane, or other multi-center-bonded boron materials, as well as any other boron-containing materials that may be used to produce silicon-and-boron-containing materials. The boron incorporation in the silicon film may be based on any percentage incorporation. For example, the produced film may include greater than or about 5% boron incorporation, and in some embodiments may include greater than or about 10% boron incorporation, greater than or about 15% boron incorporation, greater than or about 20% boron incorporation, greater than or about 25% boron incorporation, greater than or about 30% boron incorporation, greater than or about 35% boron incorporation, greater than or about 40% boron incorporation, greater than or about 45% boron incorporation, greater than or about 50% boron incorporation, greater than or about 55% boron incorporation, greater than or about 60% boron incorporation, greater than or about 65% boron incorporation, greater than or about 70% boron incorporation, greater than or about 75% boron incorporation, greater than or about 80% boron incorporation, greater than or about 85% boron incorporation, greater than or about 90% boron incorporation, greater than or about 95% boron incorporation, or greater.

The dopant precursors may include any precursor that may include carbon, oxygen, nitrogen, sulfur, or any other dopant that may adjust the structure of the deposited film to improve transparency as well as thermal resistance. Any number of carbon-containing precursors, nitrogen-containing precursors, oxygen-containing precursors, or sulfur-containing precursors may be used in embodiments of the present technology. Additionally, combination precursors may be used that include multiple of these elements. For example, an oxygen-containing precursor used in some embodiments may be nitrous oxide, which may provide both oxygen and nitrogen for incorporation within the film. The dopant incorporation may be within any range, which may be related to an extinction coefficient, where the higher the dopant incorporation, the lower the extinction coefficient of the formed film. The dopant may be selected for compatibility with the other deposition precursors. For example, when silane may be used as a silicon-containing precursor, an oxygen-containing dopant may not be diatomic oxygen in some embodiments, and nitrous oxide may be used. The films produced may have one or more elements including silicon, boron, germanium, oxygen, carbon, nitrogen, or sulfur. For example, a film may include an oxygen-and-nitrogen doped silicon-boron-germanium film, or any other combination of materials.

The dopant may be included in any amount or concentration, and may be included at greater than or about 1 at. % in the deposited film, and in some embodiments may be included at greater than or about 2 at. %, greater than or about 3 at. %, greater than or about 4 at. %, greater than or about 5 at. %, greater than or about 6 at. %, greater than or about 7 at. %, greater than or about 8 at. %, greater than or about 9 at. %, greater than or about 10 at. %, greater than or about 11 at. %, greater than or about 12 at. %, greater than or about 13 at. %, greater than or about 14 at. %, greater than or about 15 at. %, or more. In some embodiments a hydrogen-concentration may be minimized, and may be limited to an amount of incorporation based on hydrogen inclusion in the deposition precursors. An additional hydrogen precursor, such as diatomic hydrogen, may not be included in the deposition precursors. For example, in some embodiments a hydrogen concentration in the deposited film may be less than or about 5 at. %, and may be less than or about 4 at. %, less than or about 3 at. %, less than or about 2 at. %, less than or about 1 at. %, less than or about 0.5 at. %, or less.

The temperatures of the substrate may additionally impact the deposition. For example, in some embodiments the substrate may be maintained at a temperature of greater than or about 300° C., and may be maintained at a temperature of greater than or about 325° C., greater than or about 350° C., greater than or about 375° C., greater than or about 400° C., greater than or about 425° C., greater than or about 450° C., greater than or about 475° C., greater than or about 500° C., greater than or about 525° C., or greater. By performing the deposition according to some embodiments of the present technology, hydrogen may be reduced or limited within the film. Increased hydrogen incorporation may increase a compressive stress within the film, and thus films according to embodiments of the present technology may be characterized by a more tensile nature due to lower hydrogen incorporation. For example, an as-deposited film may be characterized by a compressive stress of less than or about −500 MPa, which may be based in part on the hydrogen incorporation. However, in some embodiments, method 200 may include operations that may further reduce hydrogen incorporation in the film. Unlike some conventional technologies, however, by incorporating dopants according to embodiments of the present technology, damage from subsequent processing may be reduced or limited.

For example, in some embodiments, method 200 may include thermally annealing the formed material at optional operation 225, which may occur during later processing. While the deposition may be performed at a first temperature, the thermal anneal may be performed at a second temperature greater than the first. For example, the thermal anneal may be performed at a temperature greater than or about 480° C., and the thermal anneal may be performed at greater than or about 500° C., greater than or about 510° C., greater than or about 520° C., greater than or about 530° C., greater than or about 540° C., greater than or about 550° C., greater than or about 560° C., greater than or about 570° C., greater than or about 580° C., greater than or about 590° C., greater than or about 600° C., or higher.

By performing a thermal anneal, an amount of hydrogen incorporated within the film may be removed due to outgassing, which may relax a compressive stress. The film may then become tensile in nature, and as a film with a greater amount of hydrogen becomes more tensile during outgassing, the film may exceed a threshold stress and crack. For example, some conventional films with increased hydrogen that are exposed to a thermal anneal may release hydrogen from the film, increasing the tensile stress. The stress may increase to greater than or about 1.0 GPa, and may increase to greater than or about 1.1 GPa, greater than or about 1.2 GPa, greater than or about 1.3 GPa, greater than or about 1.4 GPa, greater than or about 1.5 GPa, greater than or about 1.6 GPa, or higher, causing the film to crack. However, by utilizing dopants according to some embodiments of the present technology, a film stress subsequent a thermal anneal may be maintained at less than or about 1.50 GPa, and may be maintained at less than or about 1.45 GPa, less than or about 1.40 GPa, less than or about 1.35 GPa, less than or about 1.30 GPa, less than or about 1.25 GPa, less than or about 1.20 GPa, less than or about 1.15 GPa, less than or about 1.10 GPa, less than or about 1.05 GPa, less than or about 1.00 GPa, or less.

Additionally, as hydrogen incorporation within the film increases, this may affect film stress as discussed previously, and may additionally impact other film characteristics. For example, hardmask films may be characterized by extinction coefficients for light at different wavelengths, which may impact lithography operations. Amorphous silicon materials may be characterized by an extinction coefficient at particular parameters of about 0.2, which may allow lithography at film thicknesses of up to about 800 nm based on lower reflectance, which may impact vision through the mask. Silicon and boron films may be characterized by increased extinction coefficients for similar parameters. For example, when boron incorporation increases, the extinction coefficient may increase to greater than or about 0.3, greater than or about 0.35, greater than or about 0.4, greater than or about 0.45, or higher, although as hydrogen incorporation increases, the extinction coefficients may be at least partially reduced. However, by increasing hydrogen incorporation, selectivity may be reduced and the film may be more likely to break during subsequent thermal processing.

The effect of higher extinction coefficients for light include that lithography may be challenged, and additional processing may be needed. For example, these increased extinction coefficients may limit lithography visibility to film thicknesses below or about 400 nm, below or about 300 nm, or less. However, by increasing dopant incorporation according to embodiments of the present technology, extinction coefficients at 633 nm may be reduced to below or about 0.35, and may be reduced to below or about 0.33, below or about 0.30, below or about 0.28, below or about 0.25, or less. This may allow lithography to extend to thicknesses of greater than or about 400 nm, greater than or about 450 nm, greater than or about 500 nm, or more, without performing additional alignment key opening operations. By increasing dopant concentration according to the present technology, the film structure may be formed to improve characteristics like extinction coefficient and etch selectivity, while maintaining or limiting hydrogen incorporation. By maintaining reduced hydrogen incorporation, improved thermal resistance may be afforded, which may allow a film to maintain reduced film stresses compared to conventional films.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method comprising:
    delivering a silicon-containing precursor, a germanium-containing precursor, and a boron-containing precursor to a processing region of a semiconductor processing chamber;
    delivering a dopant-containing precursor with the silicon-containing precursor, the germanium-containing precursor, and the boron-containing precursor, wherein the dopant-containing precursor includes one or more of carbon, nitrogen, oxygen, or sulfur;
    forming a plasma of all precursors within the processing region of the semiconductor processing chamber; and
    depositing a silicon-germanium-and-boron material on a substrate disposed within the processing region of the semiconductor processing chamber, wherein the silicon-germanium-and-boron material includes greater than or about 1 at. % of a dopant from the dopant-containing precursor, and wherein a hydrogen concentration within the silicon-germanium-and-boron material is maintained below or about 5 at. %.

2. The deposition method of claim 1, wherein the silicon-germanium-and-boron material is characterized by an extinction coefficient of less than or about 0.3 at 633 nm.

3. The deposition method of claim 1, wherein a hydrogen concentration within the silicon-germanium-and-boron material is maintained below or about 3 at. %.

4. The deposition method of claim 1, further comprising:
    subsequent the depositing, performing a thermal anneal of the silicon-germanium-and-boron material.

5. The deposition method of claim 4, wherein the thermal anneal is performed at a temperature of greater than or about 500° C.

6. The deposition method of claim 4, wherein, subsequent the thermal anneal, a material stress of the silicon-germanium-and-boron material deposited is less than or about 1.5 GPa.

7. The deposition method of claim 1, wherein the silicon-containing precursor comprises silane, and wherein the boron-containing precursor comprises diborane.

8. The deposition method of claim 7, wherein the dopant-containing precursor comprises nitrous oxide.

9. A deposition method comprising:
    delivering a deposition precursor comprising boron, silicon, or germanium to a processing region of a semiconductor processing chamber;
    providing a dopant comprising carbon, nitrogen, sulfur, or oxygen to the processing region;
    forming a plasma of the deposition precursor and the dopant within the processing region of the semiconductor processing chamber;
    depositing a material incorporating the dopant, wherein the material is characterized by an extinction coefficient of less than or about 0.35 at 633 nm, and wherein a hydrogen concentration within the material is maintained below or about 5 at. %; and
    performing a thermal anneal of the material.

10. The deposition method of claim 9,
    wherein the thermal anneal is performed at a temperature of greater than or about 500° C.

11. The deposition method of claim 10, wherein, subsequent the annealing, a material stress of the material deposited is less than or about 1.5 GPa.

12. The deposition method of claim 9, wherein the extinction coefficient is less than or about 0.30 at 633 nm.

13. The deposition method of claim 12, wherein the dopant is incorporated within the material at greater than or about 2 at. %.

14. The deposition method of claim 9, wherein at least two dopants are incorporated within the material.

15. The deposition method of claim 9, wherein the material deposited comprises silicon, boron, and germanium.

16. A deposition method comprising:
    delivering at least one of a silicon-containing precursor, a boron-containing precursor, and a germanium-containing precursor to a processing region of a semiconductor processing chamber;
    delivering a dopant-containing precursor to the processing region of the semiconductor processing chamber, wherein the dopant-containing precursor includes one or more of carbon, nitrogen, oxygen, or sulfur;
    forming a plasma of all precursors within the processing region of the semiconductor processing chamber;
    depositing a doped material on a substrate disposed within the processing region of the semiconductor processing chamber, wherein the doped material includes greater than or about 1 at. % of a dopant from the dopant-containing precursor, and wherein a hydrogen concentration within the doped material is maintained below or about 5 at. %; and performing a thermal anneal of the doped material at a temperature above or about 400° C., wherein, subsequent the thermal anneal, a material stress of the doped material deposited is less than or about 1.5 GPa.

17. The deposition method claim 16, wherein an extinction coefficient of the doped material is less than or about 0.30 at 633 nm.

18. The deposition method claim 16, further comprising:
delivering a second dopant-containing precursor to the processing region of the semiconductor processing chamber, wherein the second dopant-containing precursor includes one or more of carbon, nitrogen, oxygen, or sulfur.

* * * * *